United States Patent
LeSuer et al.

(10) Patent No.: US 8,440,905 B2
(45) Date of Patent: May 14, 2013

(54) COPPER COMPLEX DYE SENSITIZED SOLAR CELL

(76) Inventors: Robert J. LeSuer, Chicago, IL (US); Kristy L. Mardis, Flossmoor, IL (US); Ali Manesh, Chicago, IL (US)

(*) Notice: Subject to any disclaimer, the term of this patent is extended or adjusted under 35 U.S.C. 154(b) by 901 days.

(21) Appl. No.: 12/567,462

(22) Filed: Sep. 25, 2009

(65) Prior Publication Data

US 2011/0073172 A1 Mar. 31, 2011

(51) Int. Cl.
*H01L 31/00* (2006.01)
*H01L 31/0256* (2006.01)
*H01L 31/18* (2006.01)

(52) U.S. Cl.
USPC .............. 136/255; 136/256; 257/E31.004; 257/436; 438/72

(58) Field of Classification Search .............. 135/255, 135/256; 257/E31.004, 436; 438/72
See application file for complete search history.

(56) References Cited

U.S. PATENT DOCUMENTS

| | | | |
|---|---|---|---|
| 5,288,700 A | 2/1994 | McDowell | |
| 6,278,056 B1 | 8/2001 | Sugihara et al. | |
| 6,586,670 B2 | 7/2003 | Yoshikawa | |
| 6,740,807 B2 | 5/2004 | Ono | |
| 7,220,914 B2 | 5/2007 | Chittibabu et al. | |
| 7,446,923 B2 | 11/2008 | Ishii et al. | |
| 2002/0040728 A1 | 4/2002 | Yoshikawa | |
| 2006/0000505 A1 | 1/2006 | Hayashi et al. | |
| 2006/0162765 A1 | 7/2006 | Minoura et al. | |
| 2007/0079870 A1 | 4/2007 | Park et al. | |
| 2007/0102040 A1 | 5/2007 | Beckenbaugh et al. | |
| 2007/0249014 A1* | 10/2007 | Agnew et al. ................. | 435/68.1 |
| 2007/0289626 A1 | 12/2007 | Brabec et al. | |
| 2008/0066802 A1 | 3/2008 | Reddy | |
| 2008/0283122 A1 | 11/2008 | Campbell et al. | |
| 2009/0099267 A1 | 4/2009 | Kumar et al. | |
| 2009/0107552 A1 | 4/2009 | Minns et al. | |
| 2009/0316250 A1* | 12/2009 | Boman et al. ................. | 359/275 |

OTHER PUBLICATIONS

Hamann, T. W.; Jensen, R. A.; Martinson, A. B. F.; Van Ryswyk, H.; Hupp, J. T. Advancing Beyond Current Generation Dye-Sensitized Solar Cells. Energy Environ. Sci. 2008, 1, 66-78.
Kong, F.; Dai, S.; Wang, K. Review of Recent Progress in Dye-Sensitized Solar Cells. Advances in OptoElectronics 2007, 1-13.
Nazeeruddin, M. K.; De Angelis, F.; Fantacci, S.; Selloni, A.; Viscardi, G.; Liska, P.; Ito, S.; Takeru, B.; Gratzel, M. Combined Experimental and DFT-TDDFT Computational Study of Photoelectrochemical Cell Ruthenium Sensitizers. J. Am. Chem. Soc. 2005, 127, 16835-16847.
Kroon, J. M., et al. Nanocrystalline Dye-Sensitized Solar Cells having Maximum Performance. Prog Photovoltaics Res Appl 2007, 15, 1-18.
Hu, L.; Dai, S.; Weng, J.; Xiao, S.; Sui, Y.; Huang, Y.; Chen, S.; Kong, F.; Pan, X.; Liang, L.; Wang, K. Microstructure Design of Nanoporous TiO2 Photoelectrodes for Dye-Sensitized Solar Cell Modules. The Journal of Physical Chemistry B 2007, 111, 358-362.
Li, J.; Wang, L.; Kong, X.; Ma, B.; Shi, Y.; Zhan, C.; Qiu, Y. A Simple and Efficient Method using Polymer Dispersion to Prepare Controllable Nanoporous TiO2 Anodes for Dye-Sensitized Solar Cells. Langmuir, Article ASAP, DOI: 0.1021/la901488j, Publication Date (Web): Jul. 2, 2009.
Robertson, N. Cu-I Versus Ru-II: Dye-Sensitized Solar Cells and Beyond. Chemsuschem 2008, 1, 977-979.
Bessho, T.; Constable, E. C.; Graetzel, M.; Redondo, A. H.; Housecroft, C. E.; Kylberg, W.; Nazeeruddin, M. K.; Neuburger, M.; Schaffner, S. An Element of Surprise—Efficient Copper-Functionalized Dye-Sensitized Solar Cells. Chem. Commun. 2008, 3717-3719.
Sakaki, S.; Kuroki, T.; Hamada, T. Synthesis of a New Copper(I) Complex, [Cu(Tmdcbpy)(2)](+) (tmdcbpy=4,4',6,6'-Tetramethyl-2,2'-Bipyridine-5,5'-Dicarboxylic Acid), and its Application to Solar Cells. J. Chem. Soc. Dalton Trans. 2002, 840-842.
Alonso-Vente, N.; Nierengarten, J. F.; Sauvage, J. P. Spectral Sensitization of Large-Band-Gap Semiconductors (Thin-Films and Ceramics) by a Carboxylated Bis(1,10-Phenanthroline)Copper(I) Complex. J. Chem. Soc. Dalton Trans. 1994, 1649-1654.
Wang, Z. S.; Li, F. Y.; Huang, C. H. Photocurrent Enhancement of Hemicyanine Dyes Containing RSO3—Group through Treating TiO2 Films with Hydrochloric Acid. J Phys Chem B 2001, 105, 9210-9217.
Igo, David H.; Elder, R.C.; Heineman, William R. EXAFS solid-state spectroelectrochemistry: effects of supporting electrolyte on the electrochemical and structural behavior of Cu(bcp)23-. J. Electroanalytical Chemistry 1991, 314, 45-57.
Leydet, Yoann; Bassani, Dario M.; Jonusauskas, Gediminas; McClenaghan, Nathan D. Equilibration between Three Different Excited States in a Bichromophoric Copper(I) Polypyridine Complex. J. Am. Chem. Soc., 2007, 129 (28), 8688-8689.
Wang et al. Photoelectric Conversion Properties of Nanocrystalline TiO2 Electrodes Sensitized with Hemicyanine Derivatives. J. Phys. Chem. B, 2000, 104, 9676-9682.
Ionic Liquids Database-(ILThermo), NIST Standard Reference Database #147, National Institute of Standards and Technology (Gaithersburg, MD) 2006; available at ilthermo.boulder.nist.gov.

* cited by examiner

*Primary Examiner* — Ling Choi
*Assistant Examiner* — Chun-Cheng Wang

(57) ABSTRACT

A dye-sensitized semiconductor includes a semiconductor, and a copper(I) coordination compound comprising 2,9-di-alkyl-diphenyl-1,10-phenanthrolinedisulfonate, on the semiconductor. The dye-sensitized semiconductor may be used as part of a photoanode in a solar cell, which also contains a counter-electrode, and a conductive medium containing a redox-active mediator, in contact with and separating the photoanode and the counter-electrode.

14 Claims, 5 Drawing Sheets

COPPER COMPLEX DYE SENSITIZED SOLAR CELL

FEDERALLY SPONSORED RESEARCH OR DEVELOPMENT

This invention was made, in part, with government support under grant no. W911NF-08-2-0039, awarded by the United States Army Research Laboratory. The Government has certain rights in this invention.

BACKGROUND

The dye-sensitized solar cell (DSSC) is a promising alternative to silicon for the creation of cost-effective and flexible solar energy conversion devices. [1,2] DSSC's are constructed by coating a semiconductor film with a layer of light-harvesting dye molecules, to form a dye-sensitized semiconductor. The dye-sensitized semiconductor and a transparent conductive substrate form the photoanode, a second conductive substrate forms the counter-electrode, and the cell is completed using an ion-conductive medium, such as an electrolyte, containing a redox-active mediator, between the photoanode and the counter-electrode. A schematic illustration of a DSSC is shown in FIG. 1, with the transparent conductive substrate shown as SnO coated glass, the semiconductor film is shown as $TiO_2$ particles, and the redox-active mediator is shown as a solution of $I^-$ and $I_3^-$ in ethylene glycol. Also shown in FIG. 1 is a load, electrically connected between the photoanode and counter-electrode, driven by electricity produced by the DSSC upon exposure to light.

The selection of dye and the chemistry of its attachment to the porous semiconductor can dramatically affect both the range of frequencies of light which can be absorbed to generate electron-hole pairs, as well as the efficiency of conversion of the absorbed light into electricity. The current "gold-standard" in DSSC performance is the polypyridyl ruthenium dyes on nanoparticles of titanium dioxide and an $I_3^-/I^-$ electrolyte solution. [3,4] In addition to adjusting the semiconductor surface [5,6] and the electrolyte [2,7] there are considerable research resources being devoted to the molecular engineering of chromophores to improve the cost-efficiency ratio of the DSSC.

N719 and related ruthenium(II) containing sensitizers strongly absorb light with wavelengths below 900 nm. Photoexcitation of these dyes leads to charge transfer from the metal to the bipyridine ligand anchored to the $TiO_2$ surface by the carboxylate group. The existence of the lowest unoccupied molecular orbital (LUMO) in close proximity to the $TiO_2$ surface results in an efficient electron injection into the conductance band for these sensitizers. Furthermore, their high redox potential allows for rapid regeneration of the photo-oxidized dye from an iodide-containing electrolyte. However, ruthenium is a costly resource in limited supply, currently 800 times more expensive than copper (STREM 2008-2010 catalog comparing prices of 99.9% powdered forms).

There have been several reports of DSSCs using copper(I) dyes. [8] While copper-containing dyes have not yet reached the solar efficiencies of the best ruthenium-containing dyes, they also have not been as carefully optimized. The complexes reported previously all contain bipyridines with substituents at the 6- and 6'-positions to stabilize the copper(I) state. They also all contain a carboxylate group either located directly [9,10] on the bipyridine ring or attached via an alkyl [9] or aromatic side-group. [11] There are no metal-containing dyes employing sulfate linkages, although several all-organic dyes containing sulfate linkages [12] have appeared in the literature.

SUMMARY

In a first aspect, the present invention is a dye-sensitized semiconductor, comprising a semiconductor, and a copper(I) coordination compound comprising 2,9-dialkyl-diphenyl-1,10-phenanthrolinedisulfonate on the semiconductor.

In a second aspect, the present invention is a solar cell, comprising a photoanode, a counter-electrode comprising a second conductive substrate, and a conductive medium containing a redox-active mediator in contact with and separating the photoanode and the counter-electrode. The photoanode comprising a first conductive substrate, a porous semiconductor on the conductive substrate, and a dye on the porous semiconductor. The dye is a copper(I) coordination compound comprising 2,9-dialkyl-diphenyl-1,10-phenanthrolinedisulfonate.

In a third aspect, the present invention is a method of generating electricity, comprising exposing the solar cell to light.

In a fourth aspect, the present invention is a method of making the dye-sensitized semiconductor by soaking the semiconductor in a solution of the copper(I) coordination compound.

DETAILED DESCRIPTION

Figure 1:
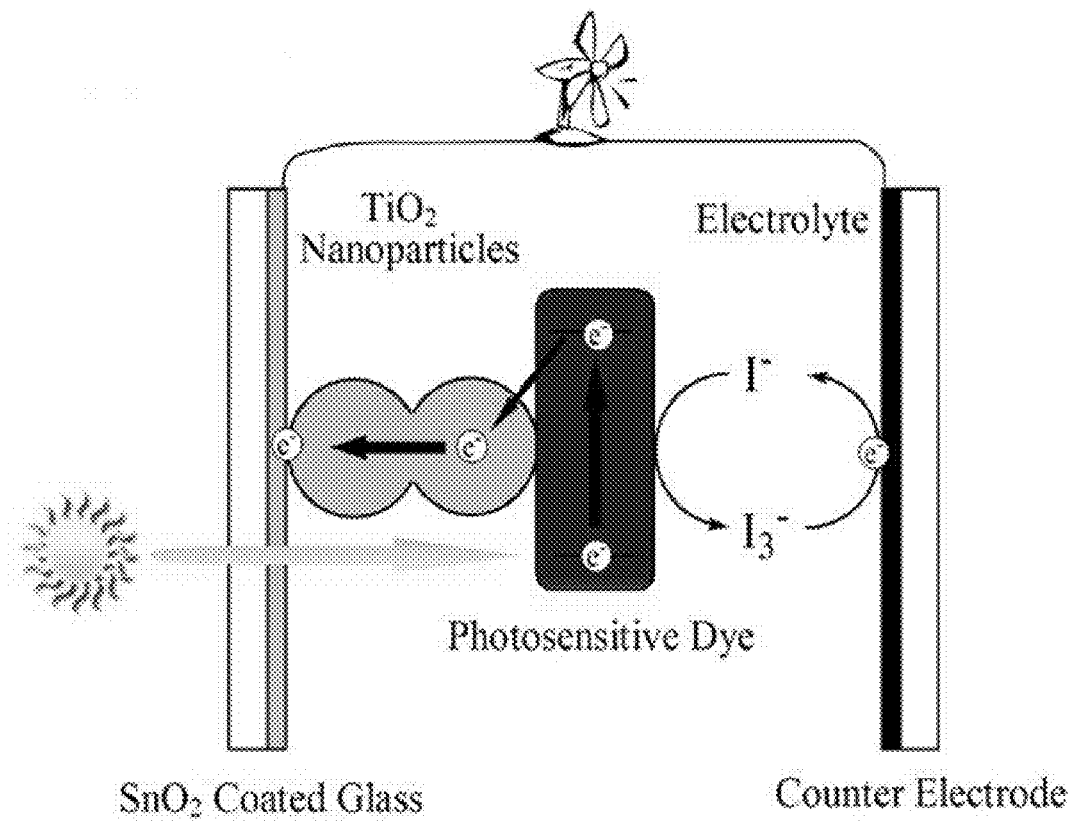
FIG. 1 illustrates a schematic of a dye-sensitized solar cell (DSSC).

The present invention makes use of the discovery of sensitizers which differ in at least two ways from existing dyes: (1) it uses copper as the metal and (2) the dye contains sulfonate instead of carboxylate as the linking group. The replacement of carboxylate with sulfonate allows the starting material to be obtained commercially. Preferably, the dye is a metal coordination compound of copper(I) and 2,9-dialkyl-diphenyl-1,10-phenanthrolinedisulfonic acid.

A DSSC typically includes a photoanode and a counter-electrode, separated by an ion-conductive medium. The photoanode includes a transparent conductive substrate, such as glass coated with a conductive tin oxide; the photoanode also includes a thin film of a porous semiconductor, such as titanium dioxide, on which is the sensitizing dye, in contact with the conductive medium. The counter-electrode may also include a transparent conductive substrate, but non-transparent substrates may also be used.

The coordinating compound is a 2,9-dialkyl-diphenyl-1,10-phenanthrolinedisulfonic acid. The alkyl groups at the 2 and 9 positions may be selected independently, and preferably the alkyl groups containing 1-10 carbon atoms, such as methyl, ethyl and propyl. Preferably, both alkyl groups are the same. Preferably, the alkyl groups are both methyl. Preferably, the phenyl groups are located on the 4 and 7 position of the phenanthroline. When the alkyl groups are methyl, the coordinating compound is 2,9-dimethyl-4,7-diphenyl-1,10-phenanthrolinedisulfonic acid (also referred to as bathocuproine sulfonic acid or BCS). BCS is commercially available as the disodium salt.

In the coordinating compound, the specific position of the sulfonate ($-SO_3^-$) groups on the phenyl rings, or on the phenanthroline, is variable; it may be in the para (as illustrated in structure 1, below), ortho, and/or meta position on the phenyl ring, or it may be located on the phenanthroline (as illustrated in structure 2, below). Other structural variations are possible, such as the presence of various substituents on the phenanthroline, however, a methyl or larger groups must be present at the 2 and 9 positions in order to maintain the copper as copper(I).

The dye may have two molecules of the coordinating compound coordinated to the copper(I) (structure 1, below), or a single coordinating compound coordinated to the copper(I), with one or more other ligands coordinated to the copper(I), such as $NCS^-$ (thiosulfate, structure 3, below), $Cl^-$, $I^-$, $Br^-$, $PPh_3$, $CN^-$, $NH_3$, $N_3^-$, $NO_2^-$; 2,4-pentanediono; 2,2'-bipyridyl; oxalato; dialkylcarbamodithioato; maleonitriledithiolato; and 1,2-ethanediylbis(diphenylphosphane). Furthermore, one or more solvent molecules may also be coordinated to the copper(I), such as water ($H_2O$) or acetonitrile ($CH_3CN$). Presumably, the dye attaches to the semiconductor via the sulfonate groups. Illustrated below are some examples dyes (structures 1, 2 and 3) where the coordinating compound is BCS:

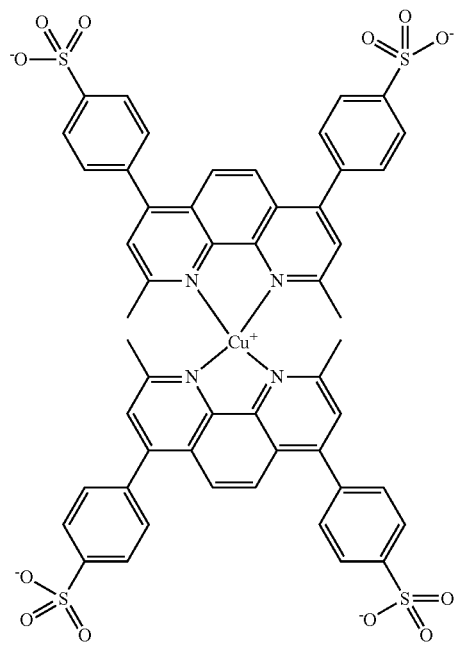

(1)

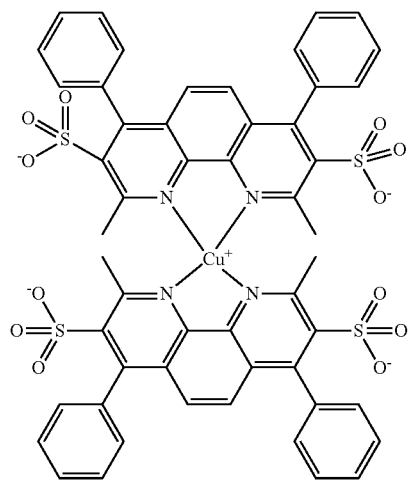

(2)

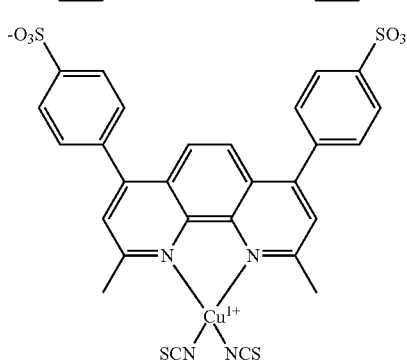

(3)

The semiconductor is sensitized with the dye by soaking in a solution of the dye. The solution may be an aqueous solution or a solution in an organic solvent, such as acetonitrile, dimethylformamide or ethanol. The solution may also contain other coordinating species, such as $NCS^-$, $Cl^-$, $I^-$, $Br^-$, $PPh_3$, $CN^-$, $NH_3$, $N_3^-$ and $NO_2^-$; these species may also absorb on the semiconductor, and may be present on the semiconductor.

The semiconductor is preferably an inorganic oxide semiconductor. Examples of oxide semiconductors include oxides of transition metals such as Ti, Nb, Zn, Sn, Zr, Y, La and Ta, and complex oxides such as $SrTiO_3$ and $CaTiO_3$. Preferably $TiO_2$ (anatase phase) or ZnO is used. Preferably, the semiconductor is in the form of a porous film. For example, a film of the semiconductor may be formed on a transparent conducting substrate by dispersing the semiconductor as a powder in solution, and then coating the dispersion onto the substrate; subsequent sintering may then be used to fix the film to the substrate. Examples of transparent conducting substrates include indium-tin oxide, fluorine-doped tin oxide, and conductive organic polymers. These may be present as a thin coat on glass. These same substrates, as well as non-transparent conductive substrates such as gold or platinum films on glass, may be used for the counter-electrode.

The ion-conductive medium is a liquid ionic conductor, such as an electrolyte solution or an ionic liquid, containing a redox-active mediator. The electrolyte may be liquid or solid. A solid electrolyte may be obtained by dispersing the electrolyte in a polymeric material. In the case of a liquid electrolyte, an electrochemically inert solvent such as acetonitrile, propylene carbonate, ethylene glycol, propylene glycol or ethylene carbonate may be used. Ionic liquids may also be used, for example organic salts with melting points of typically 100° C. or lower [16] and deep eutectic solvents (mixtures of salts which form a liquid at typically 100° C. or lower). The redox-active mediator has an oxidized form and a reduced form, both soluble in the ion-conductive medium; examples of redox-active mediators include $I^-/I_3^-$ (iodide/triiodide), $Br^-/Br_3^-$, quinone/hydroquinone or ferricyanide/ferrocyanide.

The porous semiconductor on the photoanode is sensitized with a dye. When exposed to light, the dye-sensitized semiconductor generates electron-hole pairs. If the electron and hole separate, the electrons will travel through the semiconductor to the conductive substrate of the photoanode, while the holes will oxidize the redox-active mediator, converting it from the reduced form to the oxidized form. The redox-active mediator then travels through the ion-conductive medium to the counter-electrode where it accepts an electron, reforming the reduced form of the redox-active mediator. If the photoanode and the counter-electrode are connected through a load, a current will flow between them.

EXAMPLES

Procedure for the Synthesis of $Cu(BCS)_2^{3-}$

This compound is known and its preparation is available in the literature [J. Electroanal. Chem. 314 (1991) 45-57]. Briefly, a 2:1 stoichiometric ratio of the disodium salt of BCS and copper chloride are mixed in water forming an olive green solution. Upon heating for approximately 2 hours, the solution turns red. Further stirring at room temperature for 24 hours results in a deep red solution of the bis BCS complex.

An alternate approach facilitates isolation of the target compound in solid form. A 2:1 stoichiometric ratio of the disodium salt of BCS and tetrakis(acetonitrile) copper(I) are stirred in acetonitrile under argon and are allowed to react at refluxing acetonitrile temperatures for 3 hours. The resulting red solid can be isolated from the solvent and redissolved in ethanol to serve as a dye solution.

Synthesis of Coordination Complex of Cu(I) and BCS, which Also Contains Thiocyanide:

Method 1: 50 mg of the disodium salt of BCS was mixed with 1 equivalent of copper chloride in water, resulting in a pale green solution. Addition of two equivalents of ammonium thiocyanate results in a dark green/brown solution. Upon heating or upon addition of ascorbic acid, the solution turns deep red, indicative of reduction of the Cu(II) center to Cu(I). It appears that upon cooling the solution to room temperature, the color of the solution remains red if there is a 1:1:2 stoichiometric ratio of BCS:Cu:NCS. However, if excess NCS is added to the solution, cooling to room temperature results in a color change to olive-brown. Preliminary experiments suggest that the solution retains its red color when stored under an inert atmosphere.

Method 2: 50 mg of the disodium salt of BCS is mixed with 1 equivalent of $CuCl_2$ in acetonitrile under argon. The solution is heated to reflux, after which 2 equivalents of ammonium thiocyanate are added to the solution. After reflux for about 5 hours, the acetonitrile is pale orange and a red-orange precipitate remains. The precipitate is soluble in alcohol and contains a copper complex that photosensitizes $TiO_2$.

Several attempts to synthesize the target complex in methanol have been unsuccessful. Red solutions form almost immediately upon addition of the starting materials; however the colored material does not photosensitize $TiO_2$.

Procedures for Fabricating Titanium Dioxide Thin Film:

Two procedures are currently used, both of which appear to generate similar quality films.

Procedure 1: 0.5 g of titanium dioxide powder (P25 anatase) was dispersed in about 1 mL of acidified water (10% acetic acid). The resulting suspension is stirred for a minimum of 24 hours, after which one drop of surfactant (triton X) was added. This solution was kept stirring until use. Thin films were made using the doctor blading technique using scotch tape as a mask. The wet film was calcined at about 450° C. for 30-60 minutes.

Procedure 2: titanium dioxide powder (P25 anatase) and acidified water (about 10% acetic acid) were combined in a ratio of 2 g:3 mL ratio by grinding with a mortar and pestle. Care was taken to ensure a homogenous suspension. This was most easily done by first making a smooth paste in a ratio of about 2 g power to about 1 mL liquid followed by dilution of the paste. Application of this slurry was identical to procedure 1 mentioned above.

Influence of Soak Time on DSSC Performance:

The titanium oxide films were soaked in a solution of the dyes to form the dye-sensitized semiconductor. For solutions of the $Cu(BCS)_2^{3-}$ complex, soak times up to 120 minutes showed a consistent improvement in solar cell characteristics. Increasing the soak time from 30 to 120 minutes results in a 10-fold improvement in the $I_{sc}$, a 47% improvement in the $V_{oc}$. No maximum soak time was established.

Device Fabrication:

The titanium oxide slurry prepared using Procedures 1 and 2 described above were applied to a transparent conductive substrate (TEC 8 glass, 30×30×3 mm) using a doctor blading method. A mask, serving to provide clean electrical contact points, was fabricated using cellophane tape on three of the four sides of the plate. The plate was subsequently calcined at 450° C. for 20 minutes. After cooling, the plate with the titanium dioxide surface (henceforth photoanode) was soaked in a dye solution for at least 30 minutes. The dye solutions were synthesized as described above. The dye solution concentration was based on the amount of BCS, and was typically 5 mg/mL of solvent. The solvent was typically water, although ethanol was also used as a soak solution. The sensitized photoanode was rinsed with water and alcohol and air dried. For the purposes of device performance characterization, temporary attachment of the sensitized photoanode to the counter electrode was made using binder clips. One drop of the electrolyte, 0.05 M iodine and 0.5 M potassium iodide in ethylene glycol, was allowed to permeate the space between the sensitized photoanode and the counter electrode. The device was then characterized using a potentiostat and an artificial light source.

Figure 2:
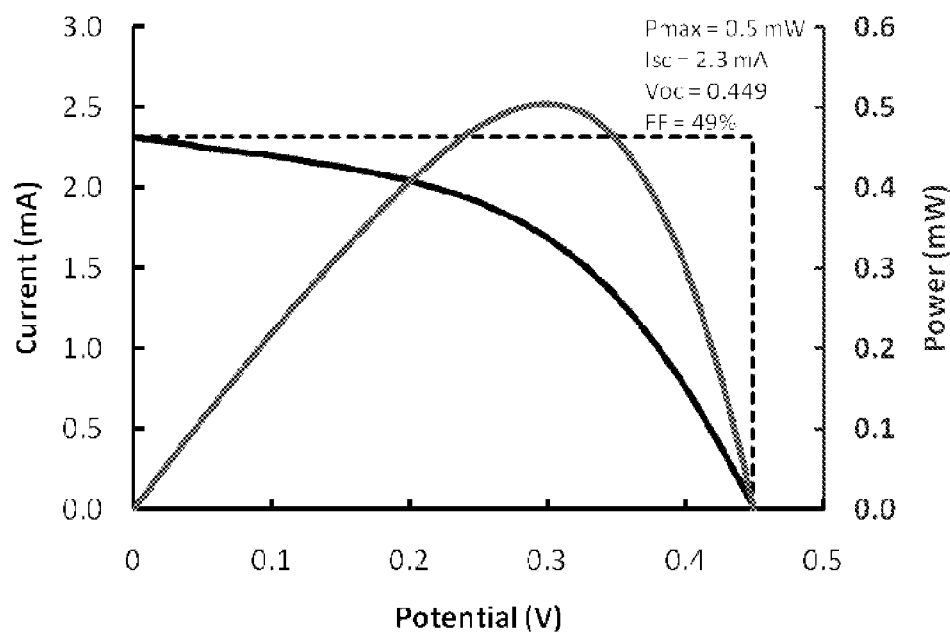
FIG. 2 illustrates a typical graph of current (vertical axis, left side) versus potential (horizontal axis) and a graph of power (vertical axis, right side) versus potential, for a DSSC with $Cu(BCS)_2^{3-}$ photosensitizer.

FIG. 2 illustrates a typical graph of current (vertical axis, left side) versus potential (horizontal axis) and a graph of power (vertical axis, right side) versus potential, for a DSSC with $Cu(BCS)_2^{3-}$ photosensitizer. The photoanode was fabricated using Procedure 1. The soak time for sensitizing the photoanode with the dye was about 1 hour.

Figure 3:
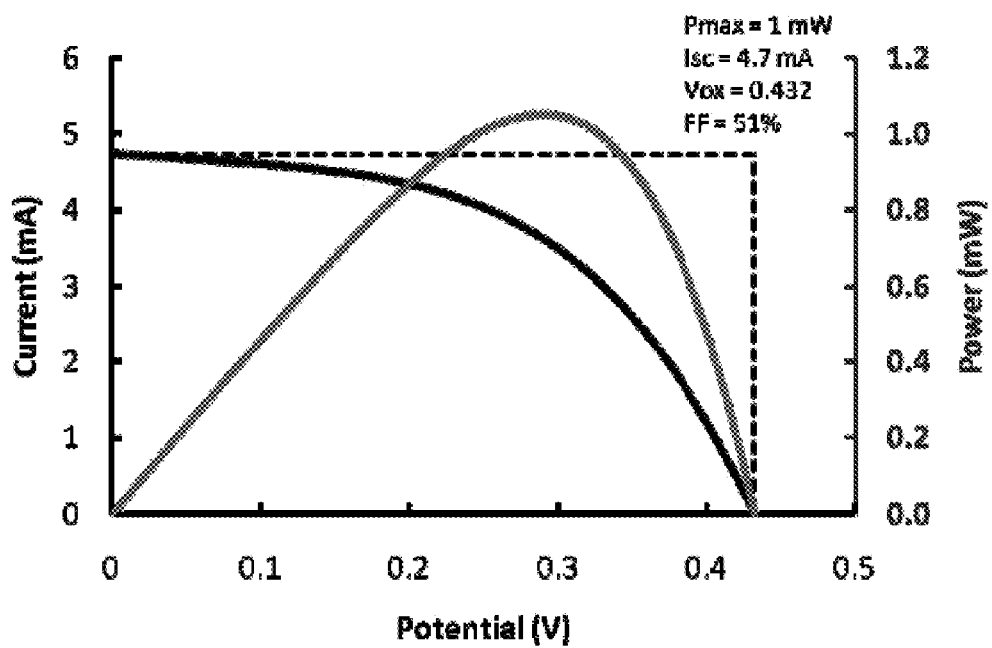
FIG. 3 illustrates a typical graph of current (vertical axis, left side) versus potential (horizontal axis) and a graph of power (vertical axis, right side) versus potential, for a DSSC with a coordination complex of Cu(I) and BCS, which also contains thiocyanide, as the photosensitizer.

FIG. 3 illustrates a typical graph of current (vertical axis, left side) versus potential (horizontal axis) and a graph of power (vertical axis, right side) versus potential, for a DSSC with a coordination complex of Cu(I) and BCS, which also contains thiocyanide, as the photosensitizer. The photosensitizer solution was made using Method 2. The photoanode was fabricated using Procedure 1. The soak time for sensitizing the photoanode with the dye was about 1 hour.

Figure 4:
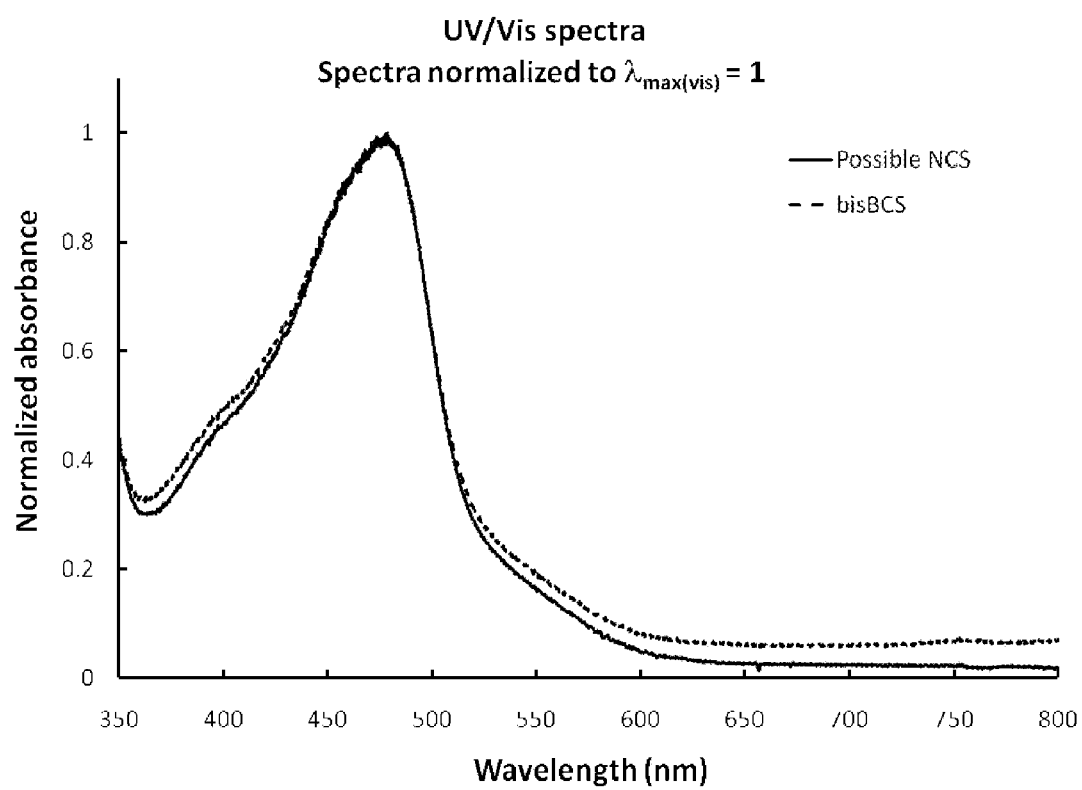
FIG. 4 illustrates the ultraviolet-visible spectra of Cu $(BCS)_2^{3-}$ (listed as bisBCS) and coordination complex of Cu(I) and BCS, which also contains thiocyanide (listed as possible NCS), both in methanol.

FIG. 4 illustrates the ultraviolet-visible spectra of $Cu(BCS)_2^{3-}$ (listed as bisBCS) and coordination complex of Cu(I) and BCS, which also contains thiocyanide (listed as possible NCS), both in methanol. The maximum absorption occurs at 483 nm. These spectra suggest that the isothiocyanate compound may not be stable in this solvent and decomposes to the $Cu(BCS)_2^{3-}$ complex.

Figure 5:
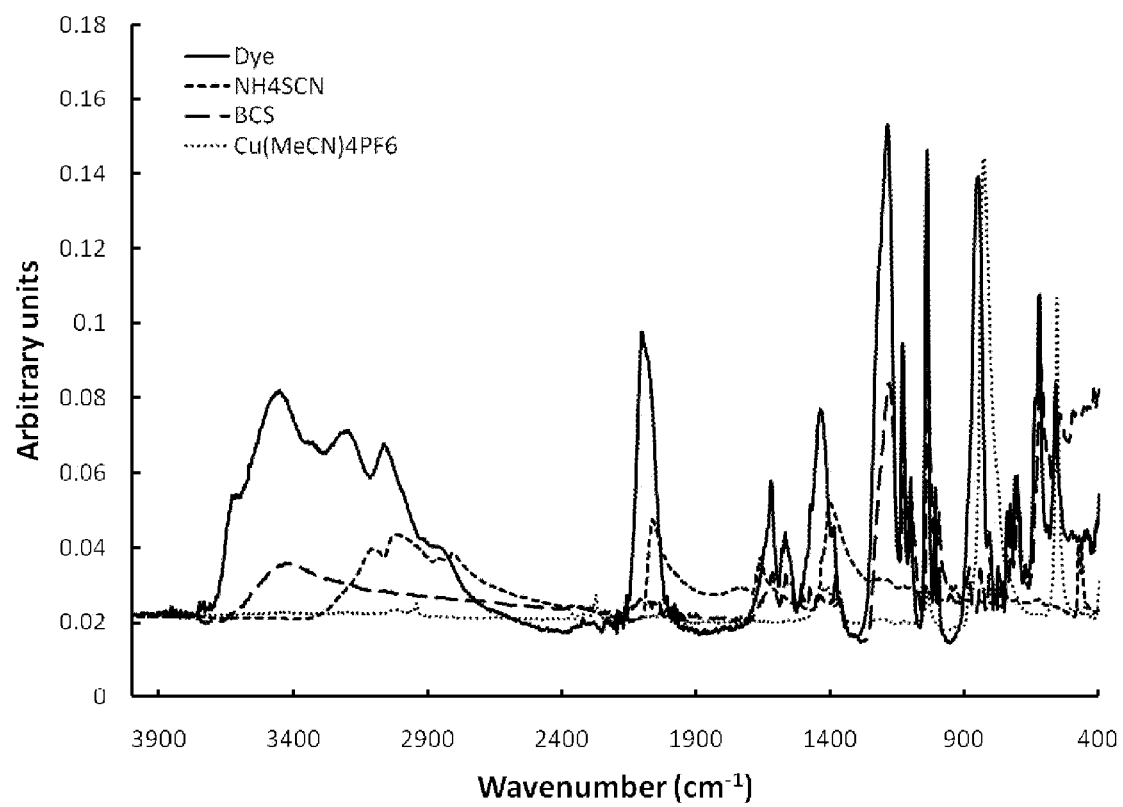
FIG. 5 illustrates the infrared spectra of coordination complex of Cu(I) and BCS, which also contains thiocyanide (listed as Dye) and starting materials for it preparation ($NH_4SCN$, BCS and $Cu(MeCN)_4PF_6$).

FIG. 5 illustrates the infrared spectra of coordination complex of Cu(I) and BCS, which also contains thiocyanide (listed as Dye) and starting materials for it preparation ($NH_4SCN$, BCS and $Cu(MeCN)_4PF_6$). The shift in the peak from 2063 $cm^{-1}$ in $NH_4SCN$ to 2101 $cm^{-1}$ in the dye suggests the $NCS^-$ ion has coordinated to the copper(I) center.

Figure 6:
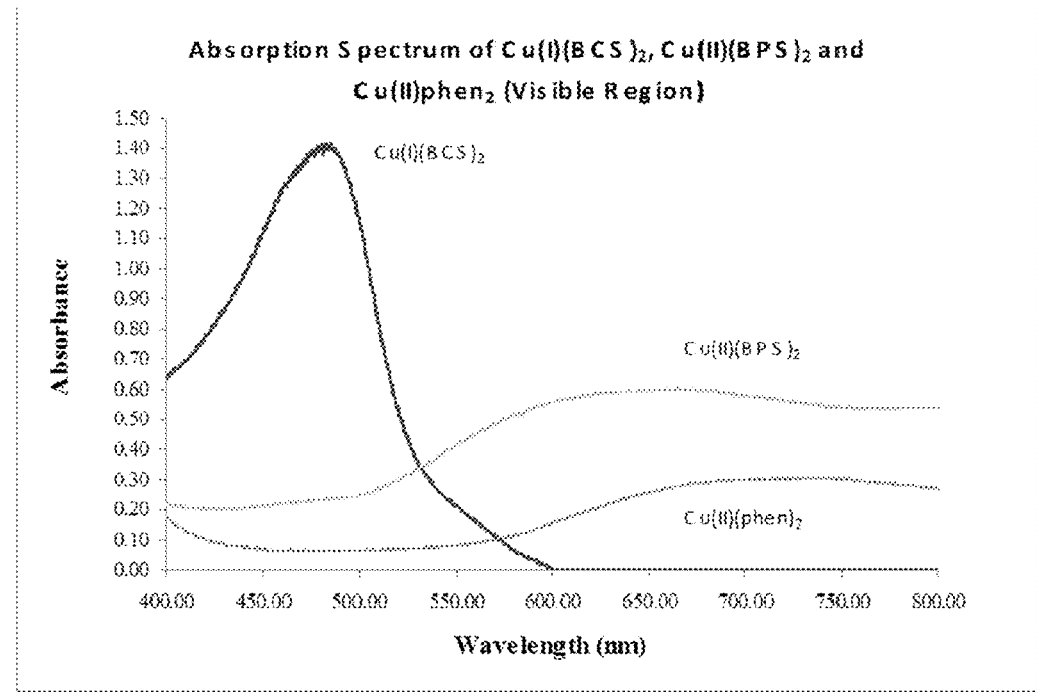
FIG. 6 illustrates the ultraviolet-visible spectra of solutions of Cu(I) $BCS_2^{3-}$, $Cu(II)BPS_2^{2-}$, and $Cu(II)phen_2^{2-}$ complexes.

FIG. 6 illustrates the ultraviolet-visible spectra of solutions of Cu(I) $BCS_2^{3-}$, $Cu(II)BPS_2^{2-}$, and $Cu(II)phen_2^{2+}$ complexes. Each complex was made in 10 mL of deionized water. A comparison of the wavelength of maximum absorption with the appropriate literature value, where available, is shown in the table below. The structures of $Cu(I)BPS_2^{2-}$ and $Cu(II)phen_2^{2+}$ are shown below.

Comparison of experimental and literature $\lambda_{max}$ values

|  | Experimental (nm) | Literature (nm) |
| --- | --- | --- |
| $Cu(I)BCS_2^{3-}$ | 485 | 483 [13] |
| $Cu(II)BPS_2^{2-}$ [Structure 4] | 746 | — |
| $Cu(II)phen_2^{2+}$ [Structure 5] | 711 | 712 [14] |

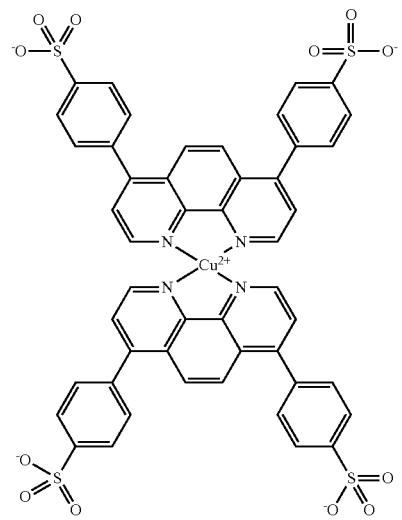

4

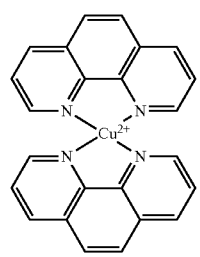

5

Figure 7:
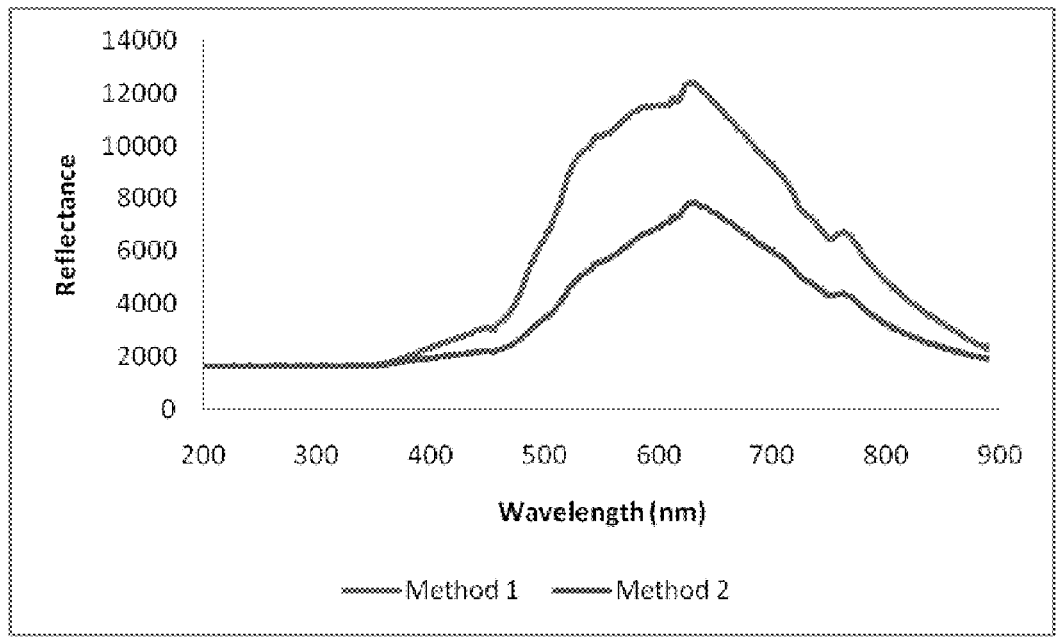
FIG. 7 illustrates the reflectance spectra of $Cu(I)BCS_2^{3-}$ on $TiO_2$ prepared by two different methods (Method 1 and Method 2).

FIG. 7 illustrates the reflectance spectra of $Cu(I)BCS_2^{3-}$ on $TiO_2$ prepared by two different methods (Method 1 and Method 2). Method 1: a 2:1 ratio of BCS and $CuCl_2$ both in 10 mL of deionized water was heat at 100° C. for approximately 2 hours and then stir for an additional 24 hours. In this experiment the copper starts off in the Cu(II) state and the heating process facilitates the change to Cu(I) state. Method 2: a 2:1 ratio of BCS and $[Cu(MeCN)_4](PF_6)_4$ (BCS in 5 mL of deionized water and the copper complex in 1 mL of methanol) are mixed together. In this experiment the copper starts off in the Cu(I) state and the heating process in method 1 is not needed.

While the foregoing written description of the invention enables one of ordinary skill to make and use what is considered presently to be the best mode thereof, those of ordinary skill will understand and appreciate the existence of variations, combinations, and equivalents of the specific exemplary embodiment and method herein. The invention should therefore not be limited by the above described embodiment and method, but by all embodiments and methods within the scope and spirit of the invention as claimed.

What is claimed is:

1. A dye-sensitized semiconductor, comprising:
a semiconductor, and
a copper(I) coordination compound comprising 2,9-dialkyl-diphenyl-1,10 phenanthrolinedisulfonate, on the semiconductor.

2. The dye-sensitized semiconductor of claim 1, wherein the 2,9-dialkyl-diphenyl-1,10-phenanthrolinedisulfonate is 2,9-dimethyl-diphenyl-1,10-phenanthrolinedisulfonate, 2,9-diethyl-diphenyl-1,10-phenanthrolinedisulfonate or 2,9-dipropyl-diphenyl-1,10-phenanthrolinedisulfonate.

3. The dye-sensitized semiconductor of claim 1, wherein the 2,9-dialkyl-diphenyl-1,10-phenanthrolinedisulfonate is 2,9-dialkyl-4,7-diphenyl-1,10-phenanthrolinedisulfonate.

4. The dye-sensitized semiconductor of claim 1, wherein the 2,9-dialkyl-diphenyl-1,10-phenanthrolinedisulfonate is 2,9-dimethyl-4,7-diphenyl-1,10-phenanthrolinedisulfonate.

5. The dye-sensitized semiconductor of claim 1, wherein the copper(I) coordination compound is copper(I)bis(2,9-dimethyl-4,7-diphenyl-1,10-phenanthrolinedisulfonate).

6. The dye-sensitized semiconductor of claim 1, wherein the copper(I) coordination compound contains at least one additional ligand selected from the group consisting of $NCS^-$, $Cl^-$, $I^-$, $Br^-$, $PPh_3$, $CN^-$, $NH_3$, $N_3^-$, $NO_2^-$; 2,4-pentanediono; 2,2'-bipyridyl; oxalato; dialkylcarbamodithioato; maleonitriledithiolato; and 1,2-ethanediylbis(diphenylphosphane).

7. The dye-sensitized semiconductor of claim 1, wherein the copper(I) coordination compound contains at least one additional ligand selected from the group consisting of $NCS^-$, $Cl^-$, $I^-$, $Br^-$, $PPh_3$, $CN^-$, $NH_3$, $N_3^-$ and $NO_2^-$.

8. The dye-sensitized semiconductor of claim 1, wherein the copper(I) coordination compound contains $NCS^-$.

9. The dye-sensitized semiconductor of claim 1, further comprising $NCS^-$.

10. The dye-sensitized semiconductor of claim 1, wherein the semiconductor is an inorganic oxide semiconductor.

11. The dye-sensitized semiconductor of claim 1, wherein the semiconductor is selected from the group consisting of oxides of Ti, Nb, Zn, Sn, Zr, Y, La and Ta, and complex oxides thereof.

12. The dye-sensitized semiconductor of claim 1, wherein the semiconductor is titanium dioxide or zinc oxide.

13. The dye-sensitized semiconductor of claim 1, wherein the semiconductor is titanium dioxide.

14. The dye-sensitized semiconductor of claim 4, further comprising $NCS^-$, wherein the semiconductor is titanium dioxide.

* * * * *